(12) United States Patent
Kotani et al.

(10) Patent No.: US 7,526,748 B2
(45) Date of Patent: Apr. 28, 2009

(54) DESIGN PATTERN DATA PREPARING METHOD, MASK PATTERN DATA PREPARING METHOD, MASK MANUFACTURING METHOD, SEMICONDUCTOR DEVICE MANUFACTURING METHOD, AND PROGRAM RECORDING MEDIUM

(75) Inventors: Toshiya Kotani, Machida (JP); Satoshi Tanaka, Kawasaki (JP); Shigeki Nojima, Yokohama (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 119 days.

(21) Appl. No.: 11/200,176

(22) Filed: Aug. 10, 2005

(65) Prior Publication Data

US 2006/0033049 A1    Feb. 16, 2006

(30) Foreign Application Priority Data

Aug. 10, 2004    (JP)    ............... 2004-233615

(51) Int. Cl.
*G06F 17/50*    (2006.01)
(52) U.S. Cl. .............................. 716/21; 716/5; 716/19
(58) Field of Classification Search ............... 716/5, 716/19–21; 430/5, 30, 394; 250/492.22
See application file for complete search history.

(56) References Cited

U.S. PATENT DOCUMENTS

| | | | |
|---|---|---|---|
| 6,473,882 B2 | 10/2002 | Mukai | |
| 6,553,544 B2 | 4/2003 | Tanaka et al. | |
| 6,578,190 B2 * | 6/2003 | Ferguson et al. | ............... 716/21 |
| 6,961,920 B2 * | 11/2005 | Zach | ........................... 716/21 |

FOREIGN PATENT DOCUMENTS

JP    2002-026126    1/2002

* cited by examiner

*Primary Examiner*—Vuthe Siek
(74) *Attorney, Agent, or Firm*—Finnegan, Henderson, Farabow, Garrett & Dunner, L.L.P.

(57) ABSTRACT

A design pattern data preparing method including preparing first mask pattern data based on first design pattern data, predicting a wafer pattern to be formed on a wafer corresponding to the first mask pattern based on the first mask pattern data, judging whether or not a finite difference between the predicted wafer pattern and the pattern to be formed on the wafer is within a predetermined allowable variation amount, correcting a portion of the first design pattern data selectively, the portion including a part corresponding to the finite difference when the finite difference is not within the allowable variation amount, and preparing second design pattern data by synthesizing the first mask pattern data corresponding to the portion including the part selectively corrected and data obtained by eliminating the first mask pattern data corresponding to the portion including the part selectively corrected from the first mask pattern data.

19 Claims, 5 Drawing Sheets

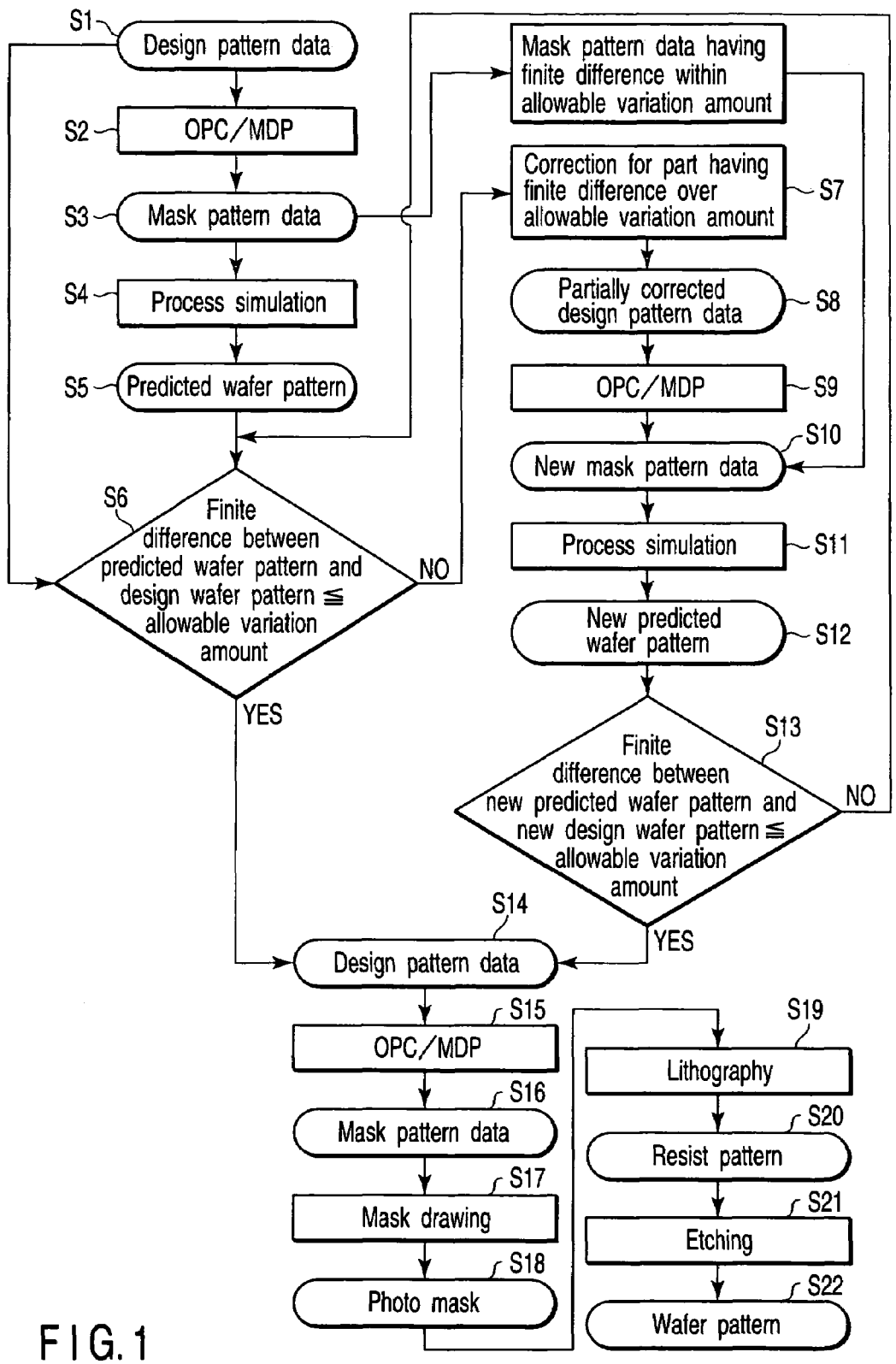
F I G. 1

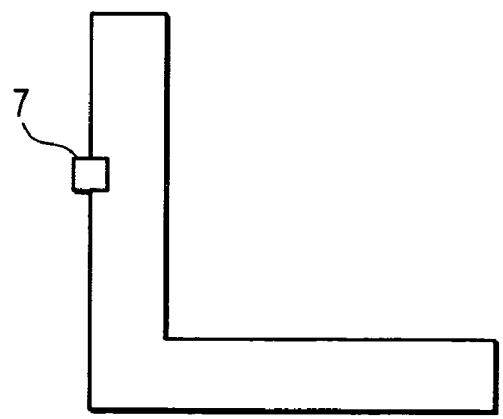
F I G. 7
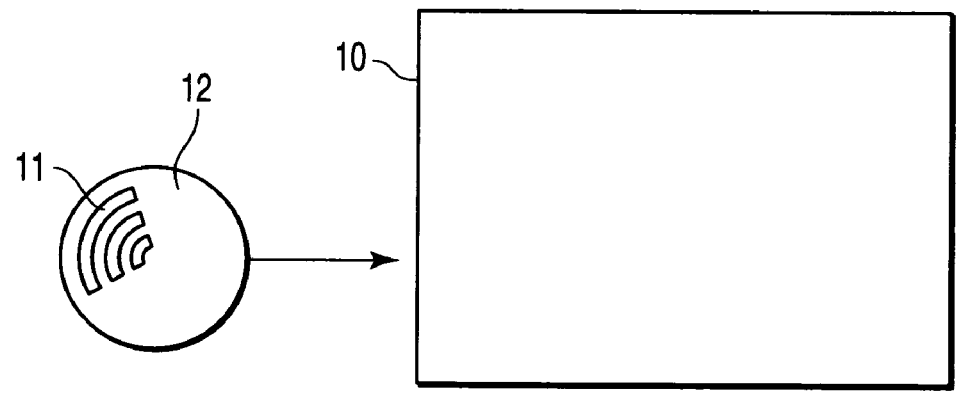
F I G. 8

DESIGN PATTERN DATA PREPARING METHOD, MASK PATTERN DATA PREPARING METHOD, MASK MANUFACTURING METHOD, SEMICONDUCTOR DEVICE MANUFACTURING METHOD, AND PROGRAM RECORDING MEDIUM

CROSS-REFERENCE TO RELATED APPLICATIONS

This application is based upon and claims the benefit of priority from prior Japanese Patent Application No. 2004-233615, filed Aug. 10, 2004, the entire contents of which are incorporated herein by reference.

BACKGROUND OF THE INVENTION

1. Field of the Invention

The present invention relates to a pattern data preparing method for a mask used in manufacturing a semiconductor device, a mask pattern data preparing method, a mask manufacturing method, a semiconductor device manufacturing method, and a program recording medium.

2. Description of the Related Art

Progress in semiconductor manufacturing technology in recent years has been remarkable, and semiconductor devices of a size of 0.13 μm, which is the minimum process dimension, have been produced in large quantities. Such miniaturization is realized by the rapid progress in fine pattern forming technology such as a mask process technology, photo lithography technology, and an etching technology.

In the days when pattern sizes were sufficiently large, a pattern simultaneously the same as a design pattern could be formed on the wafer in such a manner that the desired plane shape of an LSI pattern was drawn as is as a design pattern on a wafer; a mask pattern faithful to the design pattern was prepared; the mask pattern was transferred on the wafer by a projective optical system; and the underlying layer is etched.

However, as miniaturization of patterns has progressed, it has been difficult to faithfully form patterns in respective processes, and as a result, the problem that final finished dimensions are not made to be as the same as a design pattern has been brought about.

In order to solve such a problem, means (hereinafter, mask data process) for preparing a mask pattern different from a design pattern such that the final finished dimensions thereof are made equal to the design pattern dimensions in consideration of a conversion difference in each process have been extremely important.

As mask data process, there is a graphics computing process or a MDP (mask date process) process which changes a mask pattern by using a design rule checker (D. R. C.), or the like, and in recent years, there are optical proximity correction (OPC) process for correcting an optical proximity effect (OPE), and the like. By carrying out these processes, a mask pattern is appropriately corrected such that the final finished dimensions thereof are made to be desired dimensions.

However, in a device, such as a logic device, for which a longer TAT (Turn Around Time) is required, an increase in a process time required for mask data process directly causes an increase in TAT. One the other hand, in order to prepare a device so as to reduce the burden due to mask data process, it is necessary to relax design rules (hereinafter, D. R.). There is a risk that the relaxation in D. R. brings about a reduction in competitiveness due to an increase in a chip size.

Here, D. R. includes all rules for putting restrictions on a design layout. D. R. includes, not only layout restrictions according to a line width of a pattern, a distance of a space between patterns, and the like which have been conventionally used, but also layout restrictions according to a shape of a pattern (corners and line ends) and the like. Moreover, with respect to specifying layout restrictions, there are cases in which a layout is restricted, not only in units of dimensions (distances), areas, and the like, but also in accordance with an amount of transformation in dimensions (a resized amount) with respect to a pattern. In this way, D. R. is the general term for all rules for restricting a layout.

In order to decide D. R. under which both of an improvement in a TAT and a reduction in a chip size can be achieved, and a burden due to mask data process, there is proposed a method in which a design layout predicted to be used in the next generation is acquired by carrying out compaction onto the design property in the previous generation on the basis of D. R. used for the next generation, mask data process and lithography simulation are carried out by using the design layout, and an evaluated result thereof is fed back to D. R. (Jpn. Pat. Appln. KOKAI Publication No. 2002-26126).

In this method, because D. R. can be decided on the basis of, not only a basic pattern of a device such as that of a prior art, but also a pattern which is similar to a layout for use in an actual device, it is possible to present D. R. in which problems which may be actually brought about have been avoided in advance.

However, even if a design layout is prepared under the D. R. presented by this method, a chip size is not always made minimum. The reason for this is that, if the D. R. corresponding to a pattern having a problem are relaxed, patterns without any problem other than the pattern are relaxed, which increases a chip area in vain.

Here, a method in which D. R. are set such that only problems can be extracted by increasing the types of D. R. can be considered, but, it is impossible to allocate separate D. R. to all types of patterns. Further, due to D. R. being made complicated, difficulties such as an increase of burden on a designer preparing a design layout, a complexity in a verification by D. R. C., and the like are brought about.

If it is difficult to express all types of patterns by D. R., there is a risk that patterns which cannot be formed on a wafer in accordance with predetermined specifications provided (hereinafter, called risk patterns) are generated in at least some of the types of patterns. On the other hand, because D. R. is intimately interrelated with a chip area, a chip area is increased if numeric values of D. R. are roughly set. Accordingly, it is important to appropriately set D. R. by finding out a correlation among the number and types of risk patterns, a chip area, and D. R.

Moreover, the number of risk patterns and a chip area change in accordance with, not only the setting of D. R., but also process parameters (including parameters for mask data process).

For example, even under predetermined D. R., the number of risk patterns and a chip area are made to fluctuate when an exposure wavelength (λ) of an exposure device, a numerical aperture of the lens (NA), an illumination shape (σ, ε), a phase/a transmissivity of a mask, and the like are changed.

In order to solve those problems, a method and a system for simultaneously deciding appropriate D. R. and process parameters are proposed. By using the method and the system, not only D. R., but also process parameters with which a pattern drawn by the D. R. can be faithfully formed on a wafer can be simultaneously decided.

However, when portions A and B of the layout are focused on at the time of sequentially deciding D. R. and process parameters by using the above-described method and system, there occur some cases in which it is difficult to decide D. R. and to decide process parameters. For example, no problem is brought about under a certain D. R. 1 and a problem is brought about under the other D. R. 2 in the A portion, and in contrast thereto, a problem is brought about under D. R. 1 and no problem is brought about under the other D. R. 2 in the B portion.

Moreover, it is assumed that a partial correction in design pattern is carried out with respect to a mask once prepared, and the mask is prepared again. In this case, when parameters different from those with respect to the mask prepared already are optimum (i.e., it is necessary to change the process parameters) as a result that process parameters are optimized with respect to the design change part, there is the problem that all the layout portions other than the corrected part are made different from the mask prepared already.

In that case, it is necessary to carry out reliability evaluation under new conditions from the standpoint of the reliability of a device, which takes a great deal of time. Further, although only some portions of the design pattern have been corrected, it is necessary to carry out mask data process which takes a great deal of time onto all the patterns again. TAT is made extremely long due to such twice reliability evaluation and mask data process.

BRIEF SUMMARY OF THE INVENTION

According to an aspect of the present invention, there is provided a design pattern data preparing method for deciding design pattern data corresponding to a pattern to be formed on a wafer comprising: preparing first mask pattern data based on first design pattern data; predicting a wafer pattern to be formed on the wafer corresponding to the first mask pattern based on the first mask pattern data; judging whether or not a finite difference between the predicted wafer pattern and the pattern to be formed on the wafer is within a predetermined allowable variation amount; correcting a portion of the first design pattern data selectively, the portion including a part corresponding to the finite difference in a case where the finite difference is not within the allowable variation amount; and preparing second design pattern data by synthesizing the first mask pattern data corresponding to the portion including the part selectively corrected and data obtained by eliminating the first mask pattern data corresponding to the portion including the part selectively corrected from the first mask pattern data.

According to an aspect of the present invention, there is provided a mask pattern data preparing method for deciding mask pattern data corresponding to a pattern to be formed on a wafer comprising: preparing first mask pattern data based on first design pattern data; predicting a wafer pattern to be formed on the wafer corresponding to the first mask pattern data based on the first mask pattern data; judging whether or not a finite difference between the predicted wafer pattern and the pattern to be formed on the wafer is within a predetermined allowable variation amount; preparing first partially corrected pattern data by correcting a portion of the first design pattern data selectively, the portion corresponding to a portion included in a region over a predetermined range from a vicinity of center of a part corresponding to the finite difference of the predicted wafer pattern in a case where the finite difference is not within the allowable variation amount; and preparing second design pattern data by synthesizing data obtained by eliminating the first partially corrected pattern data from the first design pattern data and the first partially corrected pattern data; and preparing second mask pattern data based on the second design pattern data.

According to an aspect of the present invention, there is provided a mask manufacturing method comprising: preparing first mask pattern data based on first design pattern data; predicting a wafer pattern to be formed on the wafer corresponding to the first mask pattern data based on the first mask pattern data; judging whether or not a finite difference between the predicted wafer pattern and the pattern to be formed on the wafer is within a predetermined allowable variation amount; preparing first partially corrected pattern data by correcting a portion of the first design pattern data selectively, the portion corresponding to a portion included in a region over a predetermined range from a vicinity of center of a part corresponding to the finite difference of the predicted wafer pattern in a case where the finite difference is not within the allowable variation amount; and preparing second design pattern data by synthesizing data obtained by eliminating the first partially corrected pattern data from the first design pattern data and the first partially corrected pattern data; and preparing second mask pattern data based on the second design pattern data; and forming a photo mask, the forming the photo mask including drawing a pattern on mask substrate using the second mask pattern data.

According to an aspect of the present invention, there is provided a semiconductor device manufacturing method comprising: preparing first mask pattern data based on first design pattern data; predicting a wafer pattern to be formed on the wafer corresponding to the first mask pattern data based on the first mask pattern data; judging whether or not a finite difference between the predicted wafer pattern and the pattern to be formed on the wafer is within a predetermined allowable variation amount; preparing first partially corrected pattern data by correcting a portion of the first design pattern data selectively, the portion corresponding to a portion included in a region over a predetermined range from a vicinity of center of a part corresponding to the finite difference of the predicted wafer pattern in a case where the finite difference is not within the allowable variation amount; and preparing second design pattern data by synthesizing data obtained by eliminating the first partially corrected pattern data from the first design pattern data and the first partially corrected pattern data; and preparing second mask pattern data based on the second design pattern data; forming a photo mask, the forming the photo mask including drawing a pattern on mask substrate using the second mask pattern data; and forming a resist pattern on a substrate by a lithography process using the photo mask.

According to another of the present invention, there is provided a computer program product configured to store program instructions for execution on a computer system enabling the computer system to perform: an instruction to prepare first mask pattern data based on first design pattern data; an instruction to predict a wafer pattern to be formed on the wafer corresponding to the first mask pattern data based on the first mask pattern data; an instruction to judge whether or not a finite difference between the predicted wafer pattern and the pattern to be formed on the wafer is within a predetermined allowable variation amount; an instruction to prepare first partially corrected pattern data by correcting a portion of the first design pattern data selectively, the portion corresponding to a portion included in a region over a predetermined range from a vicinity of center of a part corresponding to the finite difference of the predicted wafer pattern in a case where the finite difference is not within the allowable variation amount; and an instruction to prepare second design pattern data by synthesizing data obtained by eliminating the first partially corrected pattern data from the first design pattern data and the first partially corrected pattern data; and an instruction to prepare second mask pattern data based on the second design pattern data.

BRIEF DESCRIPTION OF THE SEVERAL VIEWS OF THE DRAWING

FIG. 1 is a flowchart showing the flow from a process of preparing design pattern data to a process of preparing a wafer pattern according to the first embodiment of the present invention;

FIG. 7 is a diagram for explanation of a method of correcting extracted mask pattern data; and FIG. 8 is a diagram for explanation of a computer program product according to the embodiment.

DETAILED DESCRIPTION OF THE INVENTION

Hereinafter, embodiments of the present invention will be described with reference to the drawings.

First Embodiment

FIG. 1 is a flowchart showing the flow from a process of preparing design pattern data to a process of preparing a wafer pattern according to the first embodiment of the present invention. The design pattern data is, for example, data of a semiconductor integrated circuit device.

First, design pattern data (first design pattern data) is prepared (step S1). There is a case that predetermined design pattern data is provided.

Next, the OPC and MDP processes are applied to the design pattern data (step S2), further, a correction process for correcting pattern conversion difference in a mask process, a lithography process, and an etching process is applied to the design pattern data to prepare mask pattern data (step S3).

Next, by using the mask pattern data as input data, process simulation including a mask process, a lithography process, and an etching process are carried out by a simulator (step S4), further, wafer pattern data (data relating to a finished plane shape on a wafer) is predicted in consideration of process dispersion which may be expected to be generated in the processes including a mask process, a lithography process, and an etching process (step S5).

Next, a finite difference (a finite difference between a finished plane shape on the wafer and a plane shape of the design pattern) between the wafer pattern predicted in step S5 (predicted wafer pattern) and the pattern to be formed on the wafer (design wafer pattern) is acquired, and it is judged whether or not the finite difference is within an allowable variation amount provided in advance (step S6).

The predicted wafer pattern comprises a plurality of patterns, each of the plurality of patterns is provided with a parameter, and an allowable variation amount is determined in advance with respect to a value of the parameter. As the parameter, for example, there are a relationship with a pattern in a same layer which is at the periphery of the pattern, a relationship with a pattern above or under the pattern, device characteristics, a shape of the pattern, and the like. The allowable variation amount is determined on the basis of, for example, a determination of whether or not given device characteristics can be obtained.

Figure 2A:
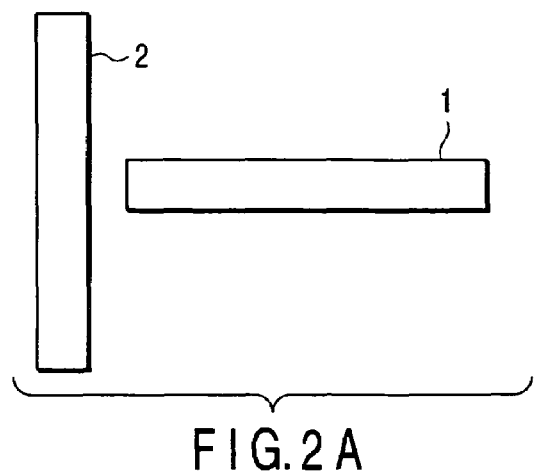
FIGS. 2A and 2B are diagrams for explanation of an example of a parameter provided to each pattern.
Figure 2B:
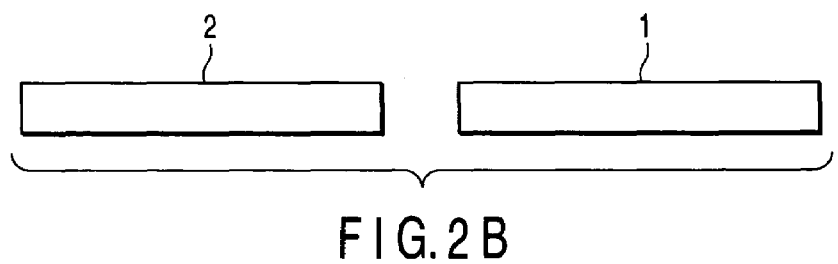

FIGS. 2A and 2B are diagrams showing an example of a relationship with a pattern which is at the periphery of the pattern. In the cases of FIGS. 2A and 2B, the allowable variation amount is varied in accordance with a state in which a line pattern 1 is perpendicular (FIG. 2A) or parallel (FIG. 2B) to a line pattern 2.

Figures 3A, 3B:
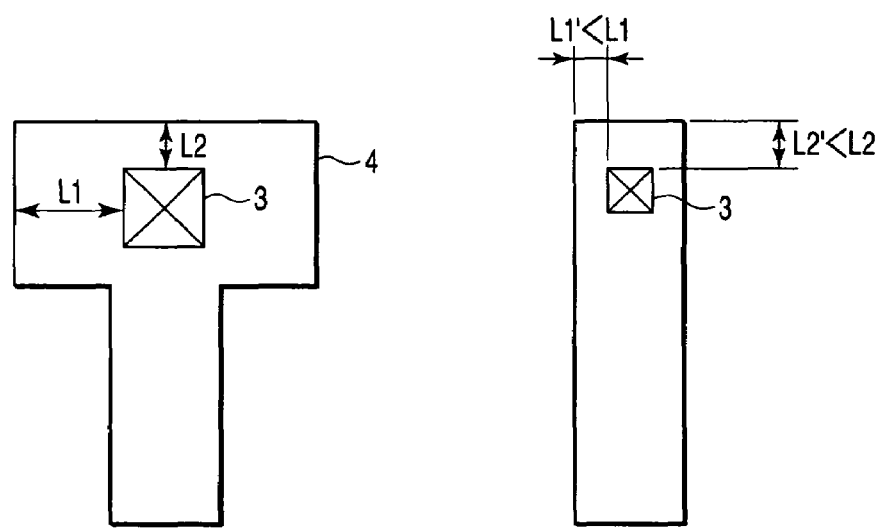
FIGS. 3A and 3B are diagrams for explanation of another example of a parameter provided to each pattern.

FIGS. 3A and 3B are diagrams showing an example of a relationship with a pattern above or under the pattern. In the cases of FIGS. 3A and 3B, the allowable variation amount is varied in accordance with a distance L from the rim portion of a contact hole 3 to the periphery portion of a wiring layer 4 on the contact hole 3, in other words, the less the alignment margin between the contact hole 3 and the wiring layer 4, the less the allowable variation amount is made. The allowable variation amount of FIG. 3A is larger than the allowable variation amount of FIG. 3B.

In step S6, in a case where a finite difference is not within the allowable variation amount, a part of the design wafer pattern which is not within the allowable variation amount is extracted, and only the design pattern data corresponding to the extracted part is corrected, which is called a partial correction is carried out (step S7), and a partially corrected design pattern data is prepared (step S8).

The partial modification will be further described.

In a case that the finite difference is large, a position having the large finite difference is set in the vicinity of the center, and a design pattern included in a region over a region of a certain size (region of a predetermined range) from the vicinity of the center is extracted. The region over the region of the certain size (region of a predetermined range) is preferably a region which is larger than a range under the influence of a shape change due to at least one process of a mask process, a lithography process, and an etching process.

It is judged that the extracted design pattern data and the mask pattern data corresponding to the design pattern data cannot ensure sufficient process latitude for achieving a predetermined dimensional variation amount under the current process condition, OPC process condition and MDP process condition. Therefore, only the extracted pattern data or the mask pattern data corresponding to the design pattern data is corrected so as to ensure process latitude under the current process conditions.

One of method for correcting the design pattern data corresponding to the extracted part (design pattern data having a large finite difference) is to change a layout such that a boundary portion between a pattern corresponding to extracted design pattern data and a pattern corresponding to design pattern which is not extracted is not contradictory by using a tool such as a compaction tool which automatically change a layout based on the design rule.

The compaction tool is a tool capable of correcting or reducing the layout so as to satisfy the design rule by inputting the layout and the design rule. Further, a target region of input design rule is applicable not only to the entire region, but also to a local region.

The second method for correcting design pattern data corresponding to the extracted part is a method which does not use a compaction tool. The method corrects design pattern data by only simple resizing process such as making line width broader or making space broader such that the finite difference of the part to be corrected is made small. Those processes can be realized by a commercial design rule check (D. R. C) tool.

Figure 4:
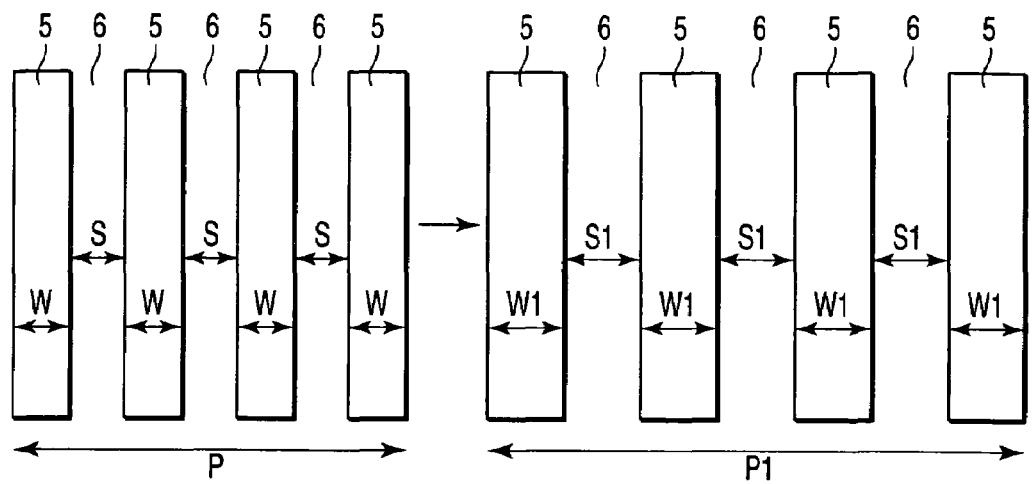
FIG. 4 is a diagram for explanation of a method of correcting design pattern data corresponding to an extracted part.

In the case of the first method, for example, as shown in FIG. 4, not only the width of the pattern of the extracted part (a line pattern 5 in FIG. 4) and the width of the space adjacent to the pattern (a line space 6 in FIG. 4) can be changed (W→W1, S→S1), but also a pattern pitch can be largely changed (P→P1), and therefore, an extremely dynamic correction of the design pattern data is possible.

Figure 5:
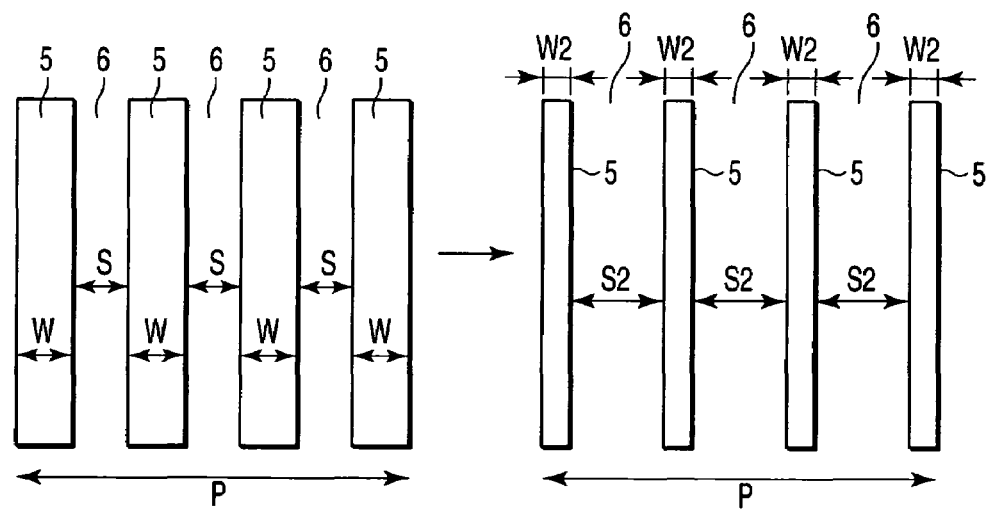
FIG. 5 is a diagram for explanation of another method of correcting design pattern data corresponding to an extracted part.

Further, as shown in FIG. 5, when there is no need to change the pitch, and only a duty ratio (which means the ratio of line width and space width when pitch is fixed. For example, a duty ratio of a 1:1 line and space (L/S) pattern is 50%) is changed, a resizing amount of the pattern (W2/S2) is easily decided on the basis of a relationship (W/S) between a width of a pattern of the extracted part (the line pattern 5 in FIG. 5) and a space adjacent to the pattern (the line space 6 in FIG. 5). Accordingly, in a case of correction by changing, not a pitch, but a duty ratio, the second method is preferably used. An actual correction is carried out by appropriately using the two methods.

Next, the OPC and MDP processes are applied to the partially corrected design pattern data (step S9), and partially corrected mask pattern data is prepared.

Next, the partially corrected mask pattern data and the mask pattern data having the finite difference within the allowable variation amount (mask pattern data corresponding to the design pattern of the part which is not extracted in step S7) are synthesized together, and new mask pattern data (the second mask pattern data) is prepared (step S10).

The mask pattern data having the finite difference within the allowable variation amount is prepared, for example, by eliminating an unnecessary portion of the original mask pattern data prepared in step S3 (i.e., the mask pattern data corresponding to the part having a large finite difference) from the mask pattern data corresponding to the design wafer pattern having a finite difference within the allowable variation amount in step S6.

Next, process simulation including a mask process, a lithography process, and an etching process are carried out by a simulator by using the new mask pattern data as input data (step S11), and wafer pattern data (data relating to the finished plane shape on the wafer) is predicted (step S12).

Next, a finite difference between the new wafer pattern predicted in step S12 and the design wafer pattern is acquired, and it is judged whether or not the finite difference is within the allowable variation amount provided in advance (step S13).

In step S13, when the finite difference is not within the allowable variation amount, steps S6 to S13 are repeated until the finite difference is made to be within the allowable variation amount.

On the other hand, when the finite difference is within the allowable variation amount in step S6, the design pattern data in step S1 is decided as the final design pattern data. Further, when the finite difference is within the allowable variation amount in step S13, data which is obtained by synthesizing the partially corrected design pattern data in step S8 and the design pattern data corresponding to the design wafer pattern having the finite difference within the allowable variation amount in step S6 is determined as the final design pattern data (new design pattern data).

The OPC and MDP processes are applied to the final design pattern data (step S15), and final mask pattern data is prepared (decided) (step S16).

When the design pattern data in step S1 is the final design pattern data, the OPC and MDP processes in step S2 are used. On the other hand, in a case where the new design pattern data is the final design pattern data, the OPC and MDP processes in step S9 are used.

There are cases in which the OPC and MDP processes in step S2 and the OPC and MDP processes in step S9 are the same and different from each other. Here, the correction method is the method for the case that the finite difference is over the allowable variation amount targets only the design pattern data. Therefore, the two OPC and MDP processes are the same. In a case that the target of the correction method includes the OPC and MDP processes, the two the OPC and MDP processes are different from each other.

A mask pattern is drawn on mask substrate by an EB drawing apparatus using the mask pattern data (step S17), and thereafter, a photo mask is manufactured by carrying out a well-known process such as development or the like (step S18).

A resist pattern is formed on a substrate (step S20) by a photo lithography process using the photo mask (step S19).

The substrate has a semiconductor wafer and a member to be processed which is provided on the semiconductor wafer. The member to be processed is an insulating film or a conductive film. In a case where the member to be processed is the insulating film, the resist pattern has a pattern corresponding to, for example, a via hole or wiring trench. In a case where the member to be processed is the conductive film, the resist pattern has a pattern corresponding to, for example, an electrode or a wiring. There is a case that the semiconductor wafer itself is the member to be processed. In this case, the resist pattern has a pattern corresponding to, for example, an isolation trench.

The member to be processed is etched by, for example, RIE (Reactive Ion Etching) process by using the resist pattern as a mask (step S21). Thereafter, the resist pattern is removed, and a desired pattern (wafer pattern) is formed on the wafer (step S22).

By repeating partial corrections of the design patterns and the mask patterns, the allowable variation amount can be achieved in all the design patterns on the wafer even considering predetermined process dispersion conditions. As the pattern corrections are merely carried out partially, it is easy to reduce the reliability evaluation of a device, and to allocate specific design rules and specific OPC and MDP process conditions to a pattern having a problem, and processing TAT can be improved.

As described above, according to the present embodiment, differently from the conventional method in which all design patterns are corrected, the variation amounts of all the design wafer patterns can be easily made to be within the allowable variation amount even taking predetermined process dispersion conditions into consideration, by correcting only design pattern data corresponding to the part having the finite difference over the allowable variation amount. As a result thereof, the design pattern data preparing method, the mask pattern data preparing method, the mask manufacturing method, and the method of manufacturing a semiconductor device, which are capable of shortening TAT, can be realized.

Because pattern corrections are merely carried out partially, it is easy to reduce the reliability evaluation of the device, and allocate specific design rules to the pattern having the problem, and an improvement in the device characteristics can be easily realized. Moreover, in a case where partial correction of the mask pattern is repeated, it is easy to allocate specific OPC and MDP process conditions, this also makes it possible to improve TAT and the device characteristics.

Second Embodiment

Figure 6:
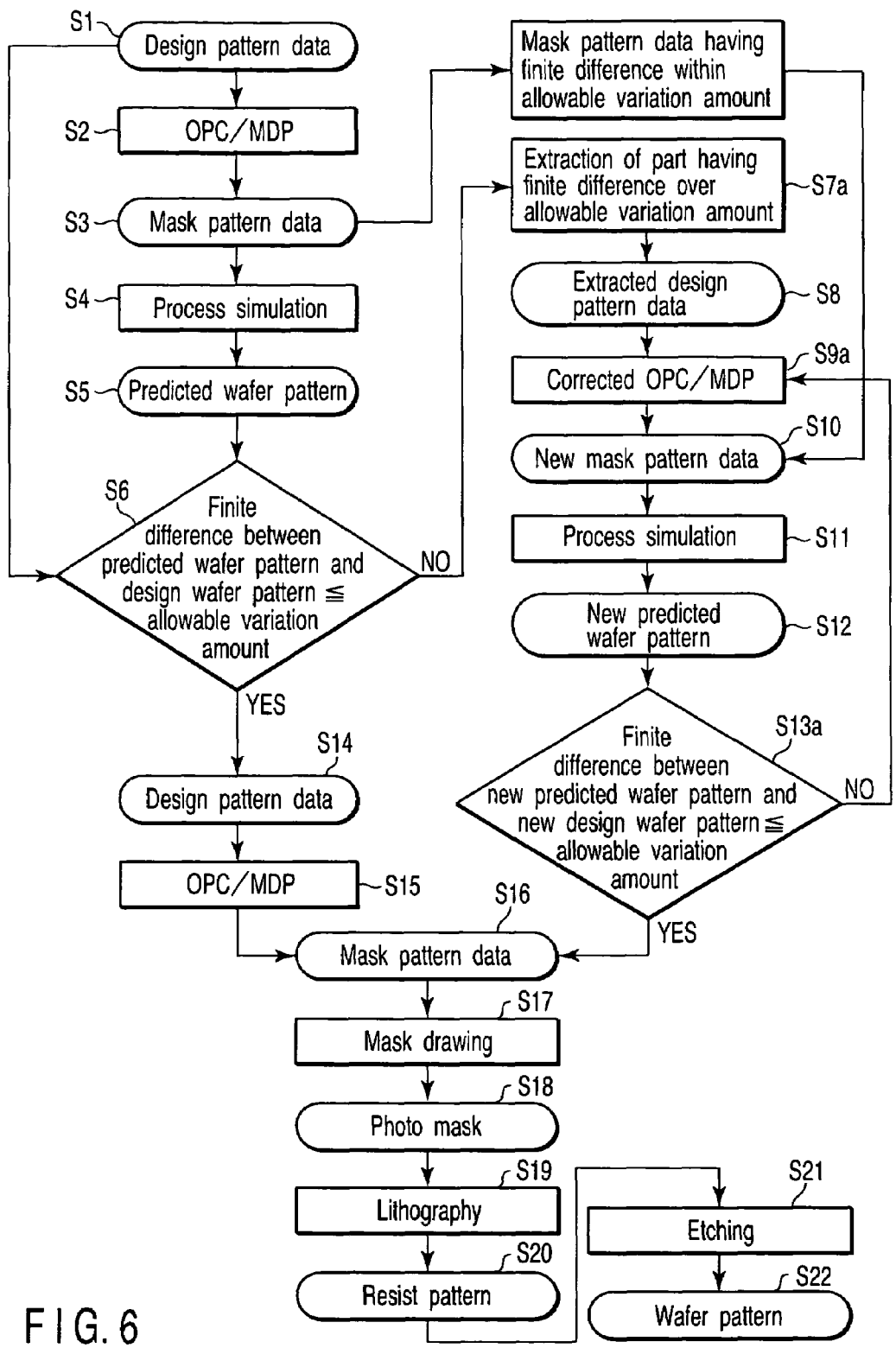
FIG. 6 is a flowchart showing-the flow from a process of preparing design pattern data to a process of preparing a wafer pattern according to the second embodiment of the present invention.

FIG. 6 is a flowchart showing the flow from a process of preparing design pattern data to a process of preparing a wafer pattern according to the second embodiment of the present invention. Note that portions corresponding to those in FIG. 1 are denoted by the same reference numerals, and detailed descriptions thereof are omitted. Further, items which are not particularly mentioned correspond to the first embodiment.

The present embodiment is different from the first embodiment in that, when the finite difference over the allowable variation amount occurs, not design pattern data, but the OPC and MDP processes are corrected.

First, in the same way as the first embodiment, steps S1 to S6 are carried out.

Next, when the finite difference is not within the allowable variation amount in step S6, a part which is not within the allowable variation amount of the predicted wafer pattern is extracted (step S7a), and design pattern data corresponding to the extracted part (extracted design pattern data) is extracted (step S8).

Next, the corrected OPC and MDP processes are applied to only the extracted design pattern data (step S9a), and partially corrected mask pattern data is prepared. Namely, a partial correction is carried out in which mask pattern data corresponding to an predicted wafer pattern of the part extracted in step S7a (extracted mask pattern data) is corrected.

There are various methods for correcting extracted mask pattern data. However, among those, as the present embodiment, the correction method is easiest in which the conditions of the OPC and MDP processes applied to the extracted part are set to be the conditions which are different from the conditions of the OPC and MDP processes applied to the part which is not extracted, and the OPC and MDP processes are applied to the extracted part.

As a concrete technique thereof, for example, a "key pattern 7" for clearly expressing a place thereof is disposed in the vicinity of the center of a part having a large finite difference, as shown in FIG. 7. It is judged that the finite difference is large at the place where the key pattern 7 is disposed and in the vicinity thereof. Therefore, only the design pattern data corresponding to the mask pattern included in a range of a certain size is extracted on the basis of the key pattern 7, and the OPC and MDP processes are applied to only the extracted design pattern data under the different conditions.

The range of the certain size is preferably a region which is larger than a range under the influence of a shape change due to at least one process of a mask process, a lithography process, and an etching process.

Next, the corrected mask pattern data and the mask pattern data having the finite difference within the allowable variation amount (mask pattern data corresponding to the design pattern data of the part which is not extracted in step S7a) are synthesized together, and new mask pattern data is prepared (step S10).

At the time of synthesizing the two mask pattern data, an unnecessary portion (mask pattern data corresponding to a part having a large finite difference) is eliminated from the original mask pattern data prepared in step S3, and thereafter, remaining mask pattern data after eliminating the unnecessary portion from the original mask pattern data and the partially corrected mask pattern data are synthesized by using Boolean operations (processes of OR, AND, NOT, and the like) of well-known MDP processing.

Next, process simulations including a lithography simulation and an etching simulation are carried out by using the new mask pattern data as input data (step S11), and wafer pattern data is predicted (step S12).

Next, a finite difference between the new wafer pattern predicted in step S12 and the design wafer pattern is acquired, and it is judged whether or not the finite difference is within an allowable variation amount provided in advance (step S13).

Here, in a case where the finite difference is not within the allowable variation amount in step S13, steps S9a to S13 are repeated until the finite difference is made to be within the allowable variation amount.

Further, in a case that the finite difference is within the allowable variation amount in step S13, the new mask pattern data in step S10 is decided as final mask pattern data (step S16).

On the other hand, in a case the finite difference is within the allowable variation amount in step S6, the design pattern data in step S1 is determined as final design pattern data (step S14). Then, the OPC and MDP processes are applied to the design pattern data (step S15), and the final mask pattern data is obtained (step S16). The OPC process and MDP processes in step S15 are the same as the OPC and MDP processes in step S1.

Thereafter, in the same way as in the first embodiment, steps S17 to S22 are carried out.

There is a case that change of the design pattern data largely affects, not only ensuring of process latitude, but also the characteristics of the device. For example, problems of increase in wiring capacitance and wiring delay are brought about in the wiring layer, a problem of transistor characteristics is brought about in the gate layer and the diffusion layer, and a problem of wiring resistance is brought about in the contact hole layer. In this way, because the change of design pattern data largely affects the characteristics of the device as well, the change cannot be necessarily carried out from only the standpoint of processes.

When design pattern data is changed, it is necessary to take the influence of the problem into consideration by predicting the influence of the problem using a device simulator and a process simulator. When it is necessary to largely correct the design pattern data, the process time may be extremely long in the method shown in FIG. 1.

Because the OPC and MDP processes are technology for changing only a mask pattern, the corrections of OPC and MDP processes do not bring about an increase in a process time differently from a case in which design pattern data is corrected. Therefore, according to the present embodiment, mask pattern data can be prepared for a short period of time when a finite difference over the allowable variation amount is generated.

Note that, in the first embodiment, the design pattern data is corrected, and in the second embodiment, the OPC and MDP conditions are corrected. However, the design pattern data, and the OPC and MDP conditions may be corrected.

Further, as shown in FIG. 8, the methods of the present embodiments described above can be implemented as a computer program product (for example, a CD-ROM, a DVD) 12 having recorded therein a program 11 to be executed by a system including a computer 10.

For example, a computer program product according to the design pattern data preparing method of the present embodiment is to cause a computer to execute steps S1 to S14 (instructions) of FIG. 1. Further, a computer program product according to the mask pattern data preparing method of the present embodiment is to cause a computer to execute steps S1 to S16 (instructions) of FIG. 1 in the present embodiment or steps S1 to S16 (instructions) of FIG. 6 in the present embodiment.

As described above, according to the present embodiment, the variation amount of all the design wafer patterns can be easily made to be within the allowable variation amount even taking predetermined process dispersion conditions into consideration, by correcting only mask pattern data corresponding to a part having a finite difference over the allowable variation amount. As a result thereof, the design pattern data preparing method, the mask pattern data preparing method, the mask manufacturing method, and the method of manufacturing a semiconductor device, which are capable of shortening TAT, can be realized.

Because pattern corrections are merely carried out partially, it is easy to allocate specific OPC and MDP process conditions, this also makes it possible to improve TAT and the device characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A design pattern data preparing method for deciding design pattern data corresponding to a pattern to be formed on a wafer comprising:
    preparing a first mask pattern data based on first design pattern data;
    predicting a wafer pattern to be formed on the wafer corresponding to the first mask pattern data based on the first mask pattern data;
    judging whether or not a finite difference between the predicted wafer pattern and the pattern to be formed on the wafer is within a predetermined allowable variation amount;
    extracting a portion from the first design pattern data, the portion relating to a plane shape on the wafer and including a part corresponding to the finite difference in a case where the finite difference is not within the allowable variation amount;
    correcting the extracted portion; and
    preparing second design pattern data by synthesizing the corrected extracted portion and data obtained by eliminating the extracted portion from the first mask pattern data.

2. The design pattern data preparing method according to claim 1,
    wherein the preparing the first mask pattern data based on the first design pattern data includes correcting pattern conversion difference cased in a mask process, a lithography process, and an etching process.

3. The design pattern data preparing method according to claim 1,
    wherein the predicting the wafer pattern to be formed on the wafer corresponding to the first mask pattern data based on the first mask pattern data is carried out by a simulator configured to predict a wafer pattern on the wafer, the wafer process.

4. The design pattern data preparing method according to claim 1,
    wherein the predicting the water pattern to be formed on the water corresponding to the first mask pattern data based on the first mask pattern data is carried out in consideration of process dispersion predicted in a mask process, a lithography process, and an etching process.

5. The design pattern data preparing method according to claim 1,
    wherein the predicted wafer pattern includes a plurality of patterns, the plurality of patterns being respectively provided with at least one parameter, and the allowable variation amount is determined in advance with respect to each of the at least one parameter.

6. The design pattern data preparing method according to claim 5,
    wherein the at least one parameter includes at least one of a relationship between the pattern and a pattern at the periphery of the pattern, a relationship between the pattern and a pattern above or under the pattern, a device characteristic, and a shape of the pattern.

7. The design pattern data preparing method according to claim 1,
    wherein the correcting the portion selectively in a case where the finite difference is not within the allowable variation amount is carried out by using a compaction tool which performs an automatic correction of a layout based on predetermined design rule.

8. A mask pattern data preparing method for deciding mask pattern data corresponding to a pattern to be formed on a wafer comprising:
    preparing first mask pattern data based on first design pattern data;
    predicting a wafer pattern to be formed on the wafer corresponding to the first mask pattern data based on the first mask pattern data;
    judging whether or not a finite difference between the predicted water pattern and the pattern to be formed on the wafer is within a predetermined allowable variation amount;
    extracting a portion from the first design pattern data, the portion relating to a plane shape on the wafer and including a part corresponding to a portion included in a region over a predetermined range from a vicinity of a center of a part corresponding to the finite difference of the predicted wafer pattern in a case where the finite difference is not within the allowable variation amount;
    preparing first partially corrected pattern data by correcting the extracted portion;
    preparing second design pattern data by synthesizing data obtained by eliminating the first partially corrected pattern data from the first design pattern data and the first partially corrected pattern data; and
    preparing second mask pattern data based on the second design pattern data.

9. The mask pattern data preparing method according to claim 8, further comprising:
    repeating from the predicting the wafer pattern on the wafer to the preparing the second design pattern data until the finite difference is made to be within the allowable variation amount with the second design pattern data being supposed as a first design wafer pattern after the preparing the second design pattern data.

10. The mask pattern data preparing method according to claim 8,
    wherein the preparing the first mask pattern data based on the first design pattern data includes correcting pattern conversion difference cased in a mask process, a lithography process, and an etching process.

11. The mask pattern data preparing method according to claim 8,
wherein the predicting the wafer pattern to be formed on the wafer corresponding to the first mask pattern data based on the first mask pattern data is carried out by a simulator configured to predict a wafer pattern on the wafer, the wafer pattern being formed via a mask process, a lithography process, and an etching process.

12. The mask pattern data preparing method according to claim 8,
wherein the predicting the wafer pattern to be formed on the wafer corresponding to the first mask pattern data based on the first mask pattern data is carried out in consideration of process dispersion predicted in a mask process, a lithography process, and an etching process.

13. The mask pattern data preparing method according to claim 8,
wherein the predicted wafer pattern includes a plurality of patterns, the plurality of patterns being respectively provided with at least one parameter, and the allowable variation amount is determined in advance with respect to each of the at least one parameter.

14. The mask pattern data preparing method according to claim 13,
wherein the at least one parameter includes at least one of a relationship between the pattern and a pattern at the periphery of the pattern, a relationship between the pattern and a pattern above or under the pattern, a device characteristic, and a shape of the pattern.

15. The mask pattern data preparing method according to claim 8,
wherein the region over a predetermined range from a vicinity of center of a part corresponding to the finite difference of the predicted wafer pattern is larger than a range under influence of a shape change due to a mask process, a lithography process, and an etching process.

16. The mask pattern data preparing method according to claim 8,
wherein the preparing second mask pattern data based on the design pattern data includes correcting pattern conversion difference caused in a mask process, a lithography process, and an etching process, and the correcting the pattern conversion difference caused in the mask process, the lithography process, and the etching process is carried out under correction condition different from those of claim 10.

17. A mask manufacturing method comprising:
preparing first mask pattern data based on first design pattern data;
predicting a wafer pattern to be formed on the wafer corresponding to the first mask pattern data based on the first mask pattern data;
judging whether or not a finite difference between the predicted wafer pattern and the pattern to be formed on the wafer is within a predetermined allowable variation amount;
extracting a portion from the first design pattern data, the portion relating to a plane shape on the wafer and including a part corresponding to a portion included in a region over a predetermined range from a vicinity of a center of a part corresponding to the finite difference of the predicted wafer pattern in a case where the finite difference is not within the allowable variation amount;
preparing first partially corrected pattern data by correcting the extracted portion;
preparing second design pattern data by synthesizing data obtained by eliminating the first partially corrected pattern data from the first design pattern data and the first partially corrected pattern data;
preparing second mask pattern data based on the second design pattern data; and
forming a photo mask, the forming the photo mask including drawing a pattern on mask substrate using the second mask pattern data.

18. A semiconductor device manufacturing method comprising:
preparing first mask pattern data based on first design pattern data;
predicting a wafer pattern to be formed on the wafer corresponding to the first mask pattern data based on the first mask pattern data;
judging whether or not a finite difference between the predicted wafer pattern and the pattern to be formed on the wafer is within a predetermined allowable variation amount;
extracting a portion from the first design pattern data, the portion relating to a plane shape on the wafer and including a part corresponding to a portion included in a region over a predetermined range from a vicinity of a center of a part corresponding to the finite difference of the predicted wafer pattern in a case where the finite difference is not within the allowable variation amount;
forming a resist pattern on a substrate by a lithography process using the photo mask.

19. A computer program product comprising a computer-readable storage medium containing instructions stored therein which, when executed in a computer system, enable the computer system to perform a method comprising:
preparing first mask pattern data based on first design pattern data;
predicting a wafer pattern to be formed on the wafer corresponding to the first mask pattern data based on the first mask pattern data;
judging whether or not a finite difference between the predicted wafer pattern and the pattern to be formed on the wafer is within a predetermined allowable variation amount;
extracting a portion from the first design pattern data, the portion relating to a plane shape on the wafer and including a part corresponding to a portion included in a region over a predetermined range from a vicinity of a center of a part corresponding to the finite difference of the predicted wafer pattern in a case where the finite difference is not within the allowable variation amount;
preparing first partially corrected pattern data by correcting the extracted portion;
preparing second design pattern data by synthesizing data obtained by eliminating the first partially corrected pattern data from the first design pattern data and the first partially corrected pattern data;
preparing second mask pattern data based on the second design pattern data; and
outputting the second mask pattern data for use in forming a photo mask.

* * * * *

UNITED STATES PATENT AND TRADEMARK OFFICE
CERTIFICATE OF CORRECTION

PATENT NO. : 7,526,748 B2  Page 1 of 1
APPLICATION NO. : 11/200176
DATED : April 28, 2009
INVENTOR(S) : Kotani et al.

It is certified that error appears in the above-identified patent and that said Letters Patent is hereby corrected as shown below:

Claim 4, column 12, line 1, change "water" to --wafer--.

Claim 4, column 12, line 2, change "water" to --wafer--.

Claim 8, column 12, line 36, change "water" to --wafer--.

Signed and Sealed this

Eleventh Day of August, 2009

David J. Kappos
*Director of the United States Patent and Trademark Office*